United States Patent
Schönleber

(10) Patent No.: US 6,379,470 B2
(45) Date of Patent: Apr. 30, 2002

(54) METHOD AND DEVICE FOR TREATING SUBSTRATES

(75) Inventor: Dietmar Schönleber, Römerstein (DE)

(73) Assignee: STEAG MicroTech GmbH (DE)

( * ) Notice: Subject to any disclaimer, the term of this patent is extended or adjusted under 35 U.S.C. 154(b) by 0 days.

(21) Appl. No.: 09/284,035

(22) PCT Filed: Sep. 16, 1997

(86) PCT No.: PCT/EP97/05053

§ 371 Date: Apr. 1, 1999

§ 102(e) Date: Apr. 1, 1999

(87) PCT Pub. No.: WO98/14282

PCT Pub. Date: Apr. 9, 1998

(30) Foreign Application Priority Data

Oct. 3, 1996 (DE) .......................... 196 40 848

(51) Int. Cl.[7] .............. B08B 7/04; B08B 3/04
(52) U.S. Cl. ............... 134/32; 134/26; 134/34; 134/61; 134/186; 134/902
(58) Field of Search ............... 134/1, 1.3, 2, 3, 134/26, 28, 32, 34, 902, 61, 105, 186; 34/72, 74, 75, 76, 77, 78

(56) References Cited

U.S. PATENT DOCUMENTS 4,722,752 A  2/1988  Steck
5,569,330 A  * 10/1996  Schild et al. .................. 134/1
5,902,402 A  *  5/1999  Durst et al. ............. 134/902 X

FOREIGN PATENT DOCUMENTS

| DE | 44 13 077 | * 10/1995 |
| DE | 195 46 990 A1 | 7/1996 |
| EP | 0 385 536 | 9/1990 |
| WO | WO 95/28736 | * 5/1994 |

* cited by examiner

Primary Examiner—Alexander Markoff
(74) Attorney, Agent, or Firm—R. W. Becker & Associates; R. W. Becker

(57) ABSTRACT

In a method for treating substrates, the substrates are lowered for treatment into a treatment fluid contained in a treatment device. The substrates are then lifted by a first receiving device at least partially out of the treatment fluid and transferred to a second receiving device for completely lifting the substrates out of the treatment fluid. The second receiving device is completely dry at the time of transfer. The drops forming at the lowest point of the substrates are drained during lifting by a drop draining element. The device for performing the method has a lifting device with a first and second receiving device and a drop draining device for draining the drops forming at the lowest point of the substrates during lifting of the substrates from the treatment fluid.

9 Claims, 1 Drawing Sheet

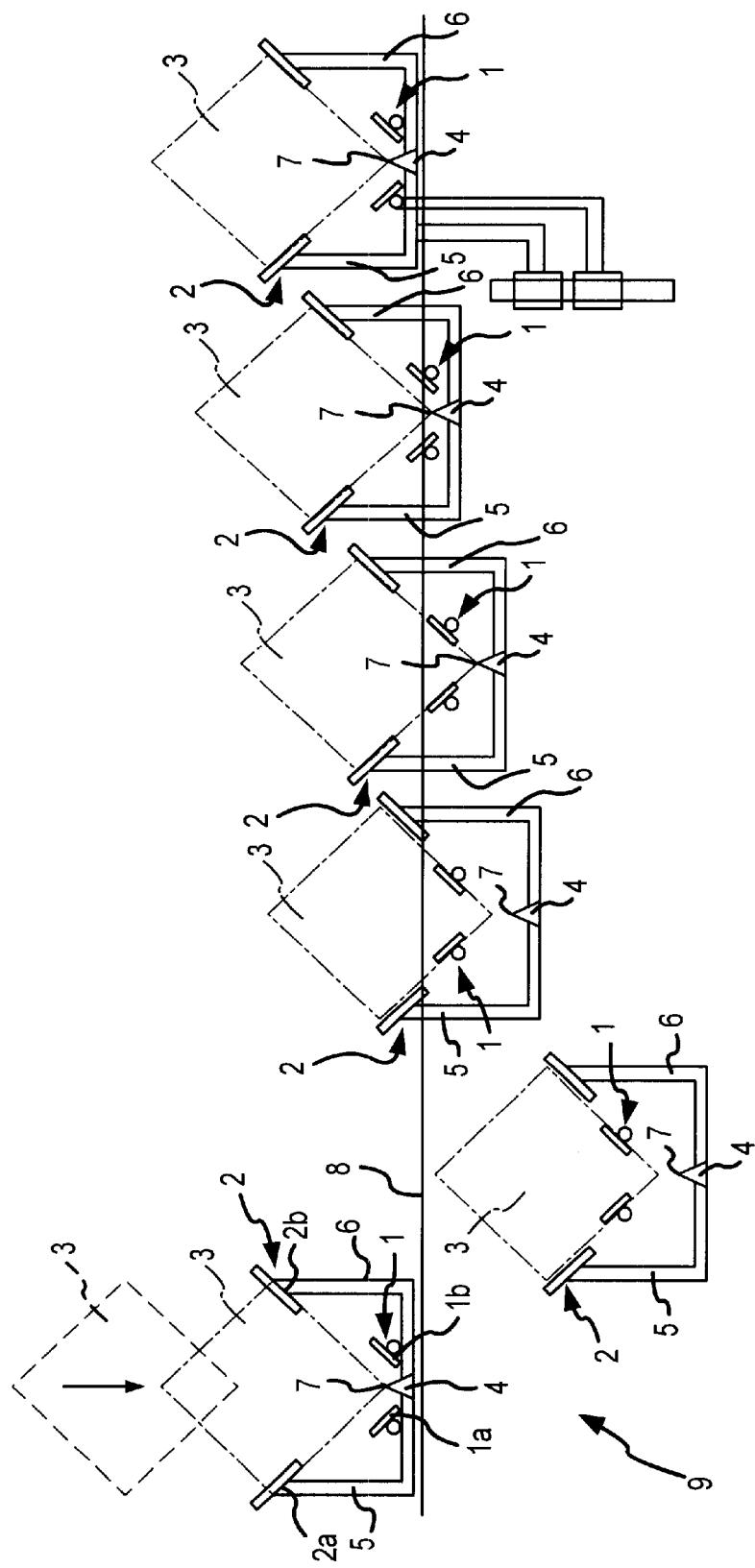

METHOD AND DEVICE FOR TREATING SUBSTRATES

BACKGROUND OF THE INVENTION

The invention concerns a method for the treatment of substrates, in which the substrates are treated in a treatment fluid and lifted in a reciprocating manner with a lifting device. Furthermore, the invention concerns a device for treating substrates in a treatment fluid with a lifting device.

A device for treating and a drying process, wherein disk-shaped substrates, for instance semiconductor wafers, are lifted with a lifting knife from a substrate carrier above the treatment fluid surface and inserted into guides of a hood, are known from DE 195 46 990 A1 of the applicant of this present patent application. After the treatment fluid has been drained from the treatment container, the dried substrates are lowered into the substrate carrier that has been dried as well and are then removed from the device together with the carrier.

This known device and method have been successfully used in practice. However, they are inefficient regarding the time required for this drying process. Furthermore, for the drying of the substrates the treatment fluid has to be drained, and this is not only time-consuming, but also requires a greater fluid consumption. Because the substrates have to be inserted into the guides of a hood during the lifting from the treatment fluid, a hood of the aforementioned kind is a necessary requirement. However, the insertion of substrates into the guides of the hood is only possible under great difficulties and with the danger of possible substrate breakage, in particular for rectangular and/or square substrates, or is not possible at all.

From EP 0 385 536 A1 a method and a device for drying substrates after treatment in a fluid are known in which the substrates are guided and secured in the guide slots of a fluid container. A lifting element presses the substrates that are held and guided in the guide slots of the fluid container in the upward direction and into an auxiliary cassette whereby the substrates, after complete removal form the treatment fluid, still remain in contact with the lifting element that is wetted with the treatment fluid. Drying of the substrates is thus not entirely ensured especially when the lifting element is at the same time the securing element for the substrates and thus has a relatively large contact area with the substrates.

From U.S. Pat. No. 4,722,752 a device and a method for rinsing and drying semi-conductor wafers are known in which the wafers are inserted into cassettes and lowered into the treatment fluid and are rinsed while positioned in the cassettes. However, these cassettes present great flow resistance for the rinsing process, especially because the wafers that are laterally secured over a large cross-sectional area by grooves or notches within the sidewalls of the cassette can be exposed only to a limited extent to the liquid. The rinsing function is therefore not satisfactory with the known device. Because of the grooves and edges, the cassette, during the upward movement through the treatment liquid surface, will not be completely dried or dried only with great time expenditure because the liquid in the grooves and on the edges can be removed only over a long period of time or not at all because of the capillary action and the minimal possibility of uninhibited flow therefrom. Furthermore, drops are formed at the lowermost points of the substrates as they are removed from the treatment fluid. These last drops represent a great contamination risk and require a large amount of time for drying so that the productivity of the device is reduced. The drying process of this device is thus dissatisfactory with respect to the drying result and the required amount of time for the drying process.

Based on this, the object of the invention is the development of a method and device for the lifting of substrates into and out of a treatment fluid that eliminate the aforementioned drawbacks of conventional devices and, in particular, provides a fast and reliable drying process and lifting procedure with simple means and with a minimum of expenditure, especially for rectangular and/or square substrates.

SUMMARY OF THE INVENTION

The object of the invention is inventively solved for a method, in which the substrates are lifted with a first receiving device at least partially out of the treatment fluid and transferred onto a second receiving device that is dry at the time of transfer of the substrates (3) to completely remove the substrates from the treatment fluid (8), by draining the drops forming at the lowest point of the substrates (3) with a drop draining device. During the lifting of substrates, a last drop is forming on the lowest, bottommost part of the substrate that does not drain off or drains only with difficulty. By draining this drop with a drop draining element, this area also is dried fast and reliably. Guides outside of the container, for instance inside a hood, are no longer needed so that guides inside a hood or possibly the hood itself is not required so that handling of rectangular and/or square substrates without the danger of substrate breakage is possible.

In as much as the second receiving device is not already dry, according to an especially advantageous embodiment of the invention, the second receiving device is being dried before it receives the substrates. The second receiving device can advantageously be dried in the same method step as the substrates. The already dried second receiving device advantageously contacts areas of substrates that have already been dried, i.e., that are already above the fluid surface above which the second receiving device is positioned during the transfer of the substrates.

The second receiving device then completely lifts the substrate areas that during the transfer from the first to the second receiving device were still in the treatment fluid, out of the fluid. No substrate area that has already been dried, contacts a receiving area that has yet to be dried. To achieve this, according to this invention, it is not necessary to drain the treatment fluid from the fluid container.

According to an especially advantageous embodiment of the invention, the first and second receiving devices are movable in a vertical direction relative to one another, wherein a reliable, safe transfer of the substrates from the first to the second receiving device is ensured. During the transfer procedure, the substrates continue to be lifted out of the treatment fluid with a generally constant speed without stops or sudden speed changes, thus minimizing the adherence of particles and contaminants at the substrates.

According to another embodiment of the invention, the substrates are loaded into and/or onto the second support of the device for loading the device and are unloaded out of or from the second support for unloading the device. When using the inventive process, no additional guides and no additional substrate carriers are required.

The inventive method is, in particular, advantageous in conjunction with a drying process based on the Marangoni principle, wherein a gas or a gas mixture, for example, isopropyl alcohol, nitrogen or a mixture of these gases is applied to the substrates to be dried, thus accelerating the drying process substantially.

Based on the aforementioned device, wherein a first receiving device lifts the substrates at least partially out of the treatment fluid and a second receiving device takes over the substrates partially lifted by the first receiving device, whereby the second receiving device is dry when receiving the substrates, the object of the invention is inventively further solved by providing a drop draining element that contacts the lowest part of the substrates at least when they have been completely lifted out of the treatment fluid. For rectangular or square substrates, the lowest point of a substrate is a corner of the substrate. The benefits of this improvement are identical to the benefits described above in conjunction with the inventive method. Here, it is also advantageous that the second receiving device is already dry during the transfer of the substrates from the first receiving device, i.e., analog to the drying process for the substrates, has already been dried, when the second receiving device is also lifted out of the treatment fluid. Areas of substrates already dried are only contacted by already dried areas of the second receiving device, so that the substrates do not contact the fluid again.

According to an advantageous embodiment of the invention, the first and second receiving devices are respectively connected to a driven and motion-controlled transport carriage in order to lift and lower the first and second receiving devices in the desired manner.

It is very advantageous in this context when the transport carriages and/or the first and second receiving devices are movable relative to one another. Preferably, the individual travel course and/or the lift speed of the transport carriages as well as their relative motion and/or speed are controllable by at least one control curve. Devices of the aforementioned kind for the motion control of the transport carriages have been described in U.S. Pat. No. 5,902,402 that is incorporated by reference into the present patent application to avoid repetition concerning this embodiment.

It should be noted that the term substrates comprises not only wafers, but all kinds of objects that are being treated in a treatment fluid and subsequently dried. The term substrates thus comprises not only semiconductor wafers, but also, in particular, LCD disks, compact disks, CDs, flat screens, masks, etc.

BRIEF DESCRIPTION OF THE DRAWINGS

The invention as well as additional features and benefits thereof is/are described in the following with the aid of FIGS. 1 through 6 schematically showing the inventive device and the step sequence of the inventive process.

DESCRIPTION OF THE PREFERRED EMBODIMENTS

FIGS. 1 through 6 schematically show a first receiving device 1 with the receiving areas 1a and 1b as well as a second receiving device 2 with the receiving areas 2a and 2b. The embodiment shown describes the invention in conjunction with the treatment of square substrates 3 that are, as being described in this example, received in the first receiving device 1 as well as the second receiving device 2.

A knife-shaped drop draining element 4 is connected to the second receiving device 2 by arms 5, 6 such that the tip 7 of the knife-shaped draining element 4 is positioned at a constant distance to the second receiving device 2 and touches the lower corner of the square substrate 3 when the substrates 3 are positioned in or on the receiving device 2.

Reference number 8 schematically indicates the fluid surface of the treatment fluid 9, into which the substrates are lowered or from which the substrates are lifted.

According to FIG. 1, the device is loaded with the substrates 3 by placing them from the top and above the fluid surface 8 parallel to each other as packages onto or into the second receiving device 2. To maintain the substrates 3 in their parallel, vertical arrangement relative to one another, the receiving device 2 and/or its receiving areas 2a and 2b are comprised of parallel extending support slots that hold the edges of the substrates 3.

The lower corners of the substrates 3 touch the tip 7 of the drop draining element 4 that, however, initially has no function during the loading of the device, shown in FIG. 1.

After loading of the second receiving device 2 with the substrates 3 according to FIG. 1, the first and second receiving devices 1, 2 are lowered until the substrates 3 are completely submerged in the treatment fluid 9, as shown in FIG. 2. In this position, the substrates are treated with a treatment fluid, for instance, a rinsing agent, as previously described, for instance, in DE 44 13 077 A.

During or after the treatment of the substrates 3 with the fluid, the first receiving device 1 is raised relative to the second receiving device 2, so that the substrates 3 are positioned in or on the first receiving device 1 and are released from the second receiving device 2. FIG. 2 shows this state.

After the treatment of the substrates 3 in the treatment fluid 9, the first as well as the second receiving devices 1, 2 are raised steadily and parallel to each other to the relative position shown in FIG. 3, thus lifting the substrates 3 above the fluid surface 8 as shown in FIG. 3 to, for instance, advantageously dry them in the area above the fluid surface 8 utilizing the Marangoni principle, which is described in EP 0 385 536 A1. In this manner, the second receiving device 2 with the receiving areas 2a and 2b is lifted above the fluid surface 8 as well and is dried utilizing the same principle, wherein the second receiving device 2 does not contact the substrates 3. During this step, the substrates 3 are being held by the receiving device 1.

After the receiving device 2 and the edge areas of the substrates 3 that have already been lifted out of the treatment fluid 9 have been dried, the first receiving device 1 and the second receiving device 2 are moved in a relative manner to one another, so that the second receiving device 2 receives the substrates 3 that are consequently released by the first receiving device 1, as schematically shown in FIG. 4. Thus, in this lifting area, the second receiving device 2 passes in its upwardly movement the first receiving device.

As shown in FIG. 5, the remaining areas of the substrates 3 that were still submerged in the treatment fluid 9, are lifted above the fluid surface 8 and dried, without interference by the first receiving device 1 since it is not contacting the substrates 3 during this process step.

After the substrates 3 have been raised completely above the fluid surface 8, the draining element 4, whose tip 7 is contacting the lower corners of the substrates 3, causes the draining of the last drops on the lower corners of the substrates. FIG. 6 schematically shows this state as well as the position for unloading the substrates

What is claimed is:

1. A method comprising the steps of:
   lowering substrates (3) for treatment into a treatment fluid (8) contained in a treatment device;
   lifting the substrates (3) by a first receiving device (1) partially out of the treatment fluid (8), wherein the first receiving device (1) remains in the treatment fluid (8) while the substrates are partially removed therefrom;
   lifting a second receiving device (2) relative to the first receiving device (1) in the vertical direction and thereby transferring the substrates (3) to the second receiving device (2);

completely lifting the substrates (3) out of the treatment fluid (8) by the second receiving device which is completely dried at the time of transfer;

draining drops forming at a lowest point (10) of the substrates (3) by a drop draining element (4) during lifting by the second receiving device (2).

2. A method according to claim 1, further comprising the step of loading the treatment device by placing the substrates (3) into or onto the second receiving device (2).

3. A method according to claim 1, further comprising the step of unloading the treatment device by removing the substrates (3) out of or from the second receiving device (2).

4. A method according to claim 1, further comprising the step of treating the substrates (3) and/or the first and/or the second receiving device (1, 2) with a gas during lifting out of the treatment fluid (8).

5. A method according to claim 4, wherein the gas is isopropyl alcohol, nitrogen, or a gas mixture of the two.

6. A device for the treatment of substrates (3) in a treatment fluid (8), said device comprising:

a lifting device having a first receiving device (1) for lifting the substrates (3) partially out of the treatment fluid (8), wherein the first receiving device (1) remains in the treatment fluid (8) while the substrates are removed therefrom, and a second receiving device (2) for receiving the substrates (3), wherein said second receiving device (2) during transfer of the substrates is dry;

a drop draining element (4) contacting a lowest point (10) of the substrates (3) during lifting by the second receiving device (2).

7. A device according to claim 6, wherein the substrates (3) are rectangular and said lowest point (10) of the substrates (3) is a corner (4) of the substrate (3).

8. A device according to claim 6, further comprising transport carriages, wherein each one of said first and second receiving devices (1, 2) is connected to one of said transport carriages.

9. A device according to claim 8, wherein said transport carriages and said first and second receiving devices (1, 2) are movable in a vertical direction relative to one another.

* * * * *